US009754989B2

(12) United States Patent
Huang et al.

(10) Patent No.: US 9,754,989 B2
(45) Date of Patent: Sep. 5, 2017

(54) METHOD FOR READING OUT MULTIPLE SRAM BLOCKS WITH DIFFERENT COLUMN SIZING IN STITCHED CMOS IMAGE SENOR

(71) Applicants: Steven Huang, Pasadena, CA (US); Christophe Ca Basset, Pasadena, CA (US); Sam Bagwell, Pasadena, CA (US); Jonathan Bergey, Pasadena, CA (US); Loc Truong, Pasadena, CA (US)

(72) Inventors: Steven Huang, Pasadena, CA (US); Christophe Ca Basset, Pasadena, CA (US); Sam Bagwell, Pasadena, CA (US); Jonathan Bergey, Pasadena, CA (US); Loc Truong, Pasadena, CA (US)

( * ) Notice: Subject to any disclaimer, the term of this patent is extended or adjusted under 35 U.S.C. 154(b) by 553 days.

(21) Appl. No.: 13/902,009

(22) Filed: May 24, 2013

(65) Prior Publication Data

US 2013/0334401 A1    Dec. 19, 2013

Related U.S. Application Data

(60) Provisional application No. 61/651,240, filed on May 24, 2012.

(51) Int. Cl.
*H01L 27/146* (2006.01)
*H04N 5/335* (2011.01)
*H04N 3/14* (2006.01)

(52) U.S. Cl.
CPC ..... *H01L 27/14634* (2013.01); *H04N 3/1593* (2013.01); *H04N 5/335* (2013.01)

(58) Field of Classification Search
CPC ............. H01L 27/146; H01L 27/14601; H01L 27/14603; H01L 27/14609; H01L 27/14634; H01L 27/14636; H01L 27/14645; H01L 27/14643; H01L 27/14683; H01N 5/3355; H04N 3/1593; H04N 3/155; H04N 5/335
See application file for complete search history.

(56) References Cited

U.S. PATENT DOCUMENTS

| 5,652,163 | A  * | 7/1997 | Schinella ............ G03F 7/70433 438/599 |
| 6,605,488 | B1 * | 8/2003 | Andersson ........ H01L 27/14603 250/492.22 |
| 6,795,367 | B1 * | 9/2004 | Tsai ...................... H04N 3/155 257/E27.132 |
| 8,643,399 | B1 * | 2/2014 | Vanderhoek ..... H03K 19/17744 326/41 |

(Continued)

OTHER PUBLICATIONS

Extended Dynamic Range From a Combined Linear-Logarithmic CMOS Image Sensor, Graeme Storm, et al, IEEE Journal of Solid-State Circuits, vol. 41, No. 9, Sept. 2006.

(Continued)

*Primary Examiner* — John Lee
(74) *Attorney, Agent, or Firm* — Law Office of Scott C Harris Inc

(57) ABSTRACT

A stitched image sensor array on a semiconductor substrate with identical blocks that have wherein said first configuration includes enable inputs, which vary a function of the block depending on the connection to the enable inputs. The enable inputs can set an SRAM to receive different numbers of inputs.

13 Claims, 4 Drawing Sheets

(56) References Cited

U.S. PATENT DOCUMENTS

| | | | | |
|---|---|---|---|---|
| 8,816,892 B2* | 8/2014 | Huang | .................. | H03M 1/687 |
| | | | | 341/118 |
| 8,886,696 B1* | 11/2014 | Langhammer | ........ | G06F 7/5324 |
| | | | | 326/38 |
| 2002/0101528 A1* | 8/2002 | Lee | ........................ | H04N 3/155 |
| | | | | 348/304 |
| 2004/0150735 A1* | 8/2004 | Tsai | ........................ | H04N 3/155 |
| | | | | 348/294 |
| 2004/0184341 A1* | 9/2004 | Tsai | ........................ | H04N 3/155 |
| | | | | 365/230.03 |
| 2009/0179141 A1* | 7/2009 | Sarig | ................ | H01L 27/14643 |
| | | | | 250/208.1 |
| 2011/0069189 A1* | 3/2011 | Venkataraman | .. | H01L 27/14618 |
| | | | | 348/218.1 |
| 2011/0108708 A1* | 5/2011 | Olsen | .................. | G02B 3/0062 |
| | | | | 250/208.1 |
| 2012/0206889 A1* | 8/2012 | Norman | .................. | H01L 23/50 |
| | | | | 361/761 |
| 2013/0314265 A1* | 11/2013 | Mansoorian | ........ | H03M 1/1235 |
| | | | | 341/156 |
| 2013/0334401 A1* | 12/2013 | Huang | .............. | H01L 27/14634 |
| | | | | 250/208.1 |

OTHER PUBLICATIONS

Image Alignment and Stitching:A Tutorial, Richard Szeliski, Last updated, Dec. 10, 2006, Technical Report MSR-TR-2004-92, Microsoft Research.

\* cited by examiner

METHOD FOR READING OUT MULTIPLE SRAM BLOCKS WITH DIFFERENT COLUMN SIZING IN STITCHED CMOS IMAGE SENOR

This application claims priority from Provisional application No. 61/651,240, filed May 24, 2012, the entire contents of which are herewith incorporated by reference.

BACKGROUND

Large area CMOS image sensors that are larger than a standard reticle size can be fabricated by stitching together multiple sensor devices.

FIG. 1 shows a "floor plan" of such a stitched image sensor with blocks B, D, E, F and H stamped multiple times to construct the final chip. FIG. 2 shows more detail the individual repeat blocks. The stamped segments using the same repeat block are physically identical to each other. In essence, this forms multiple different chip parts on the same semiconductor substrate. In this example, the portion A is a timing part, B is a bottom column parallel readout, C is I/O and bias, D is a row driver, E is a pixel array block, F is an I/O device, G is pixel and row timing, and H is a top readout block.

By repeating these parts on the chip, a larger size image can be obtained. However, the operation of the chip foundry often requires that all the stamped parts be identical.

In a column parallel readout image sensor, typically there are identical column readout channels that read out the signal of each pixel. FIG. 3 shows a typical block diagram of the architecture. The data is read from a pixel such as 300, through a programmable gain array amplifier 302, A/D converted at 304, and stored into an SRAM column 310. Once the data is stored into each SRAM column 310, the digital readout block 320 serially reads out each column into a high-speed output port 330. Typically there is a mapping of X number of SRAM columns into 1 Output Port.

SUMMARY

The inventors recognize the situation in which a stitched CMOS sensor is needed where different blocks have different number of pixels.

An embodiment discloses blocks with stitched numbers of pixels, where each block is physically identical, but yet the blocks can be configured to handle different numbers of pixels.

A method and device of reading out multiple SRAM readout blocks with different column sizing for a Stitched CMOS image sensor is disclosed herein along with applications of that device.

DETAILED DESCRIPTION

A "Stitched" CMOS image sensor is constructed by piecing together smaller "repeat" blocks into a larger chip. Chip foundries offer this process as a method of building very large size image sensors that would otherwise not fit into a standard reticle. Each "repeat" block should be physically identical in design.

The inventors recognize, however, that the mapping of SRAM readout columns to each output port is not necessarily identical. This in essence provides different functionalities to the different blocks. Therefore, in this case, the number of SRAM columns to read out is different in one block (at FIG. 1 block H) than it is in a different block. The present application recognizes advantages that would be obtained from a way of distinguishing between these different blocks.

In an image sensor, there are often provided so-called dark pixels that provide a reference signal. These dark pixels do not receive any light input, and hence provide a reference indicative of noise level and other characteristics of the chip. Different numbers of these dark pixels may be provided. These pixels are only provided at edges of the image sensor array.

The dark pixels are physically different than the light pixels. Hence, these are placed and handled outside the repeated segments. These can be part of the repeated segments, here blocks D and F, according to the present application. However, the repeat stitch block must be physically identical, therefore external pins and additional logic is required to distinguish this functionality.

Figure 1:
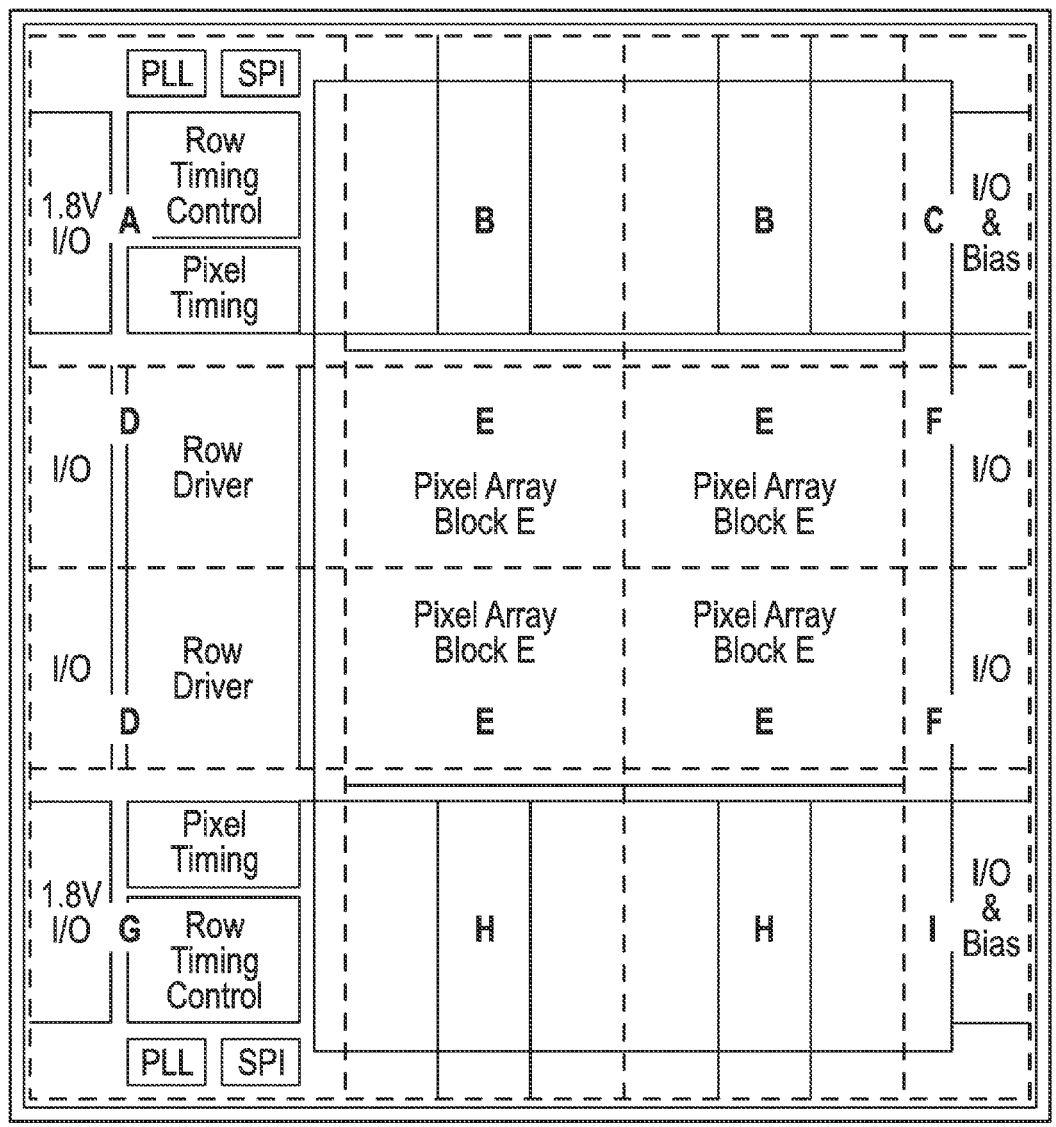
FIG. 1 shows a plan layout of a stitched sensor block.
Figure 2:
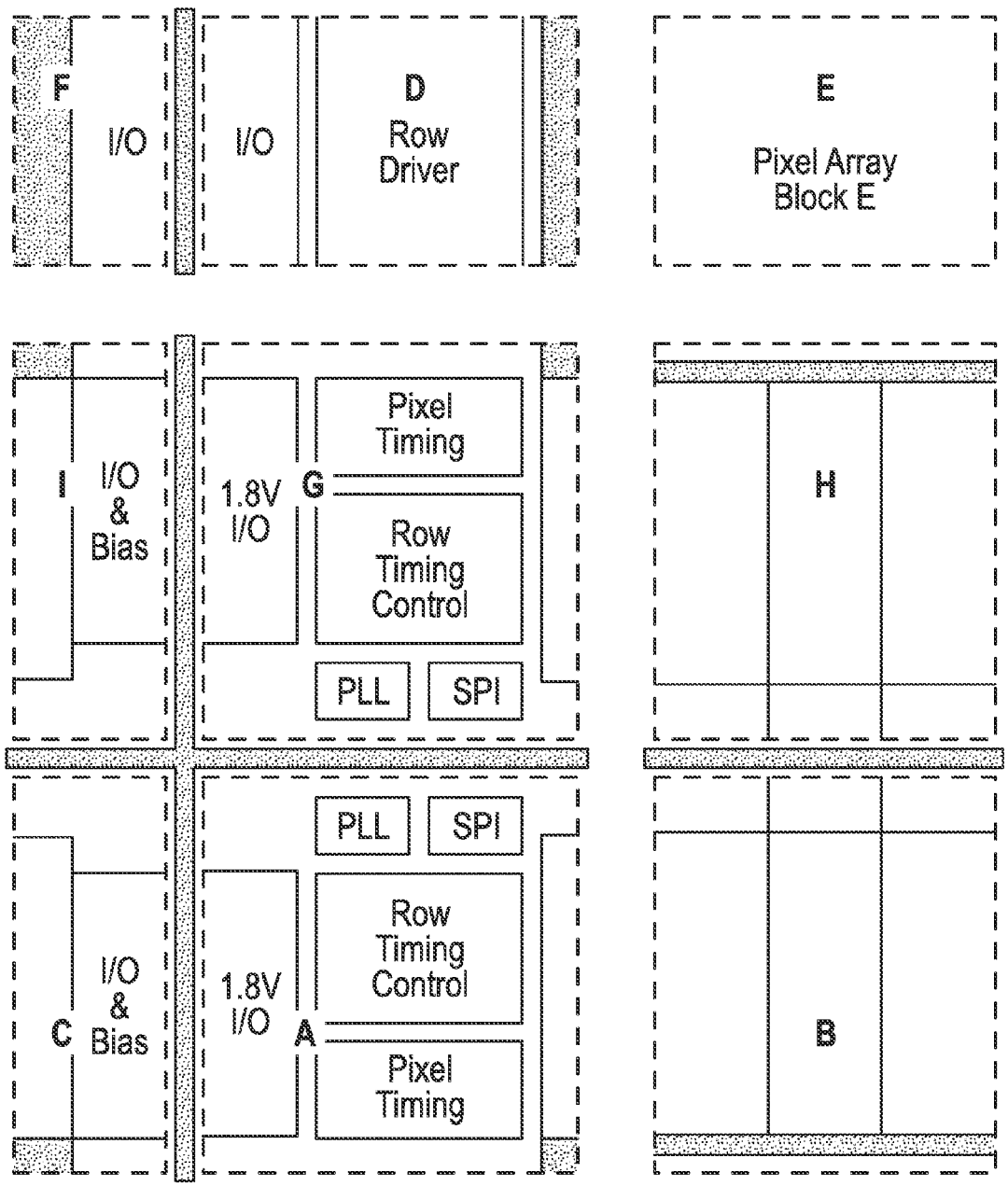
FIG. 2 shows the elements of the block.
Figure 3:
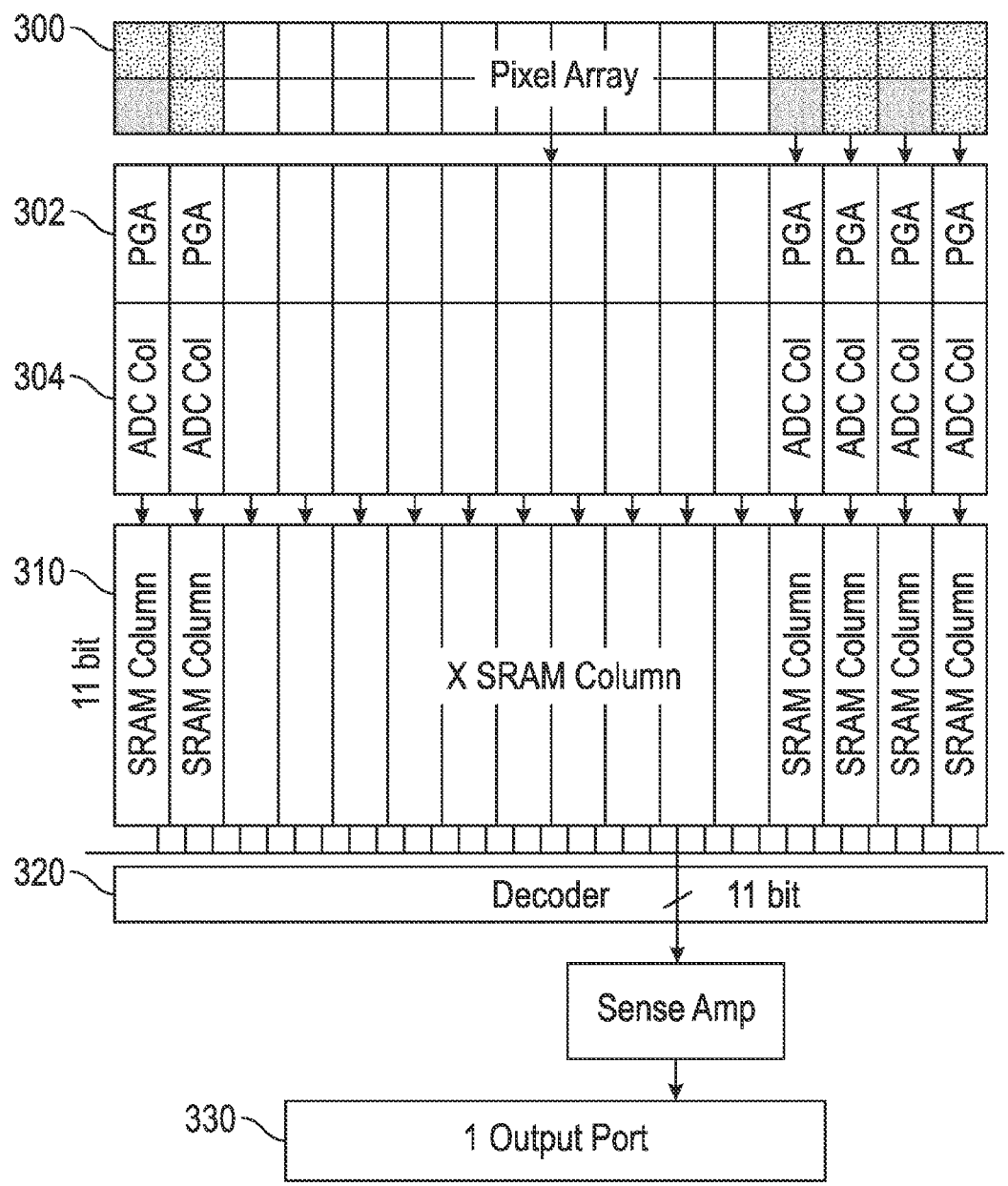
FIG. 3 shows a column parallel readout device.
Figure 4:
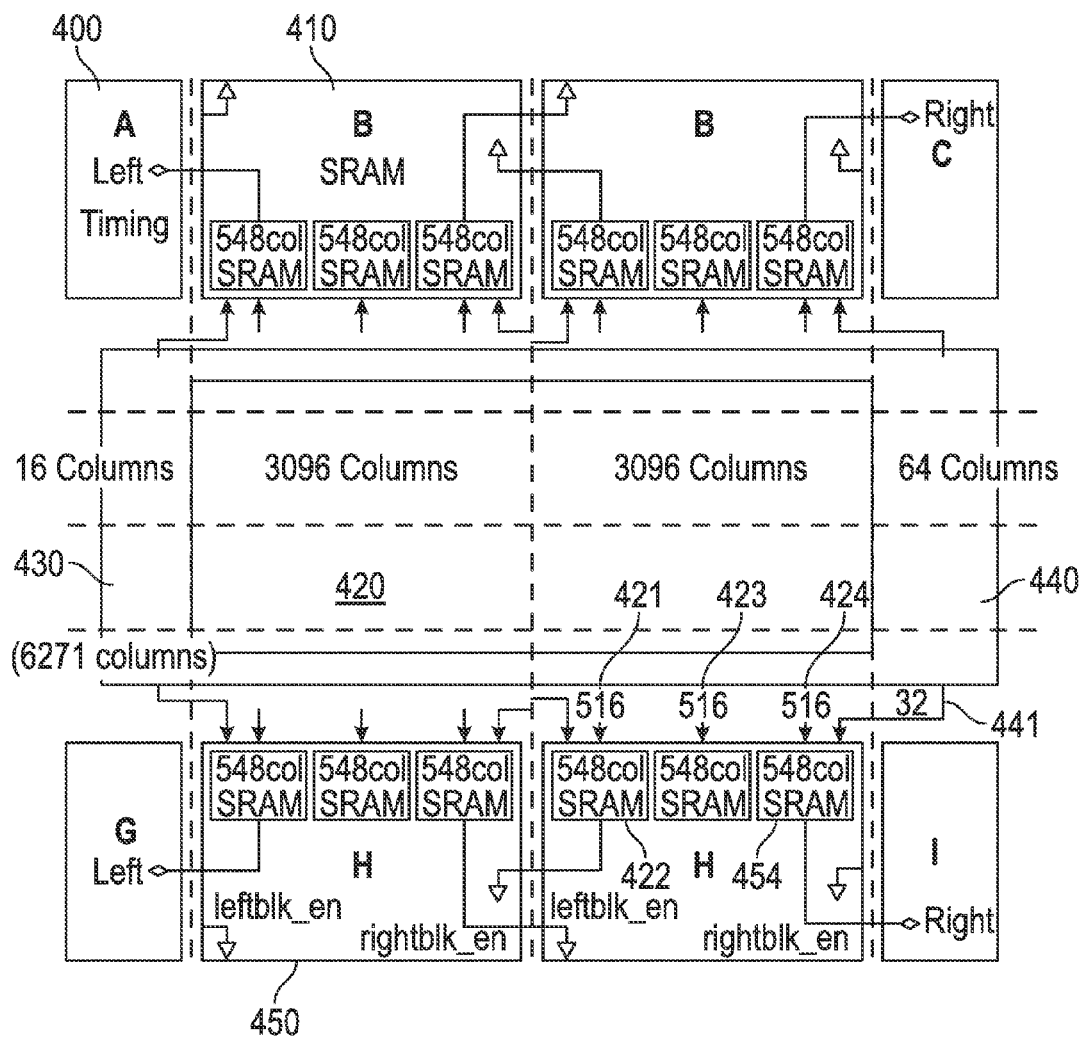
FIG. 4 shows an embodiment with connection variations.

FIG. 4 shows an embodiment which illustrates this issue. The embodiment includes a number of stitched repeat blocks which are repeated throughout the image sensor. A block "A" 400 provides timing to a block "B" 410 that provides SRAM. The other blocks described above can also be used in this situation. The pixel array block E in FIG. 1 is shown as 420.

However, according to an embodiment, the edge pixels also need to output extra "dark pixels. The left portion of the array for example has 16 columns of dark pixel shown as 430. The right portion of the array has 64 extra columns of dark pixels 440. For this to happen, the different portions of the array must have different functionality.

In order to carry this out, the embodiment of FIG. 4 operates as follows. Two different sets of SRAM blocks are used, shown as SRAM top readout 410, and SRAM bottom readout 450. The block size for each output port is the largest number of columns that will ever be read out in any embodiment. In this embodiment, the largest number of columns to be read out will be 548. Therefore, a 548 column SRAM 454 is then used in each block.

Each readout from the pixel array can have a maximum of 516 columns at a time into each SRAM chip. For example, the pixel array 420 is shown outputting 516 columns at 421 into the 548 column SRAM 422. In a similar way, 423 is shown output to an SRAM, and 424 also shows outputting 516 columns to an SRAM.

In addition, however, there are extra input columns at the edge of the array, shown as 64 extra columns, being output as 32 columns at 441. This 32 column output is combined with the 516 column output 424. Thus, both 441 and 424 are input into the 548 column SRAM 454. The Extra input columns are routed from the edge of the repeat block.

In order to set the parameters of the SRAM, the embodiment builds in a 2 bit block selection logic into the SRAM. The embodiment shows this the control signals being (rightblk_en, leftblk_en). The polarity of these enable signals sets whether a SRAM block is configured to be a Left most Block, a Right Most Block or a Middle Block. In this embodiment, the block selection pins are routed to the edge of the repeat block, here block H 450. The abutting blocks to the left and right of block H are used to determine the functionality of the block itself. For example, by placing Block G to the left of Block H enables the leftblk_en pin of Block H. This makes the block H into a leftmost pixel, providing the configuration for the leftmost pixel. By placing Block I to the right of Block H enables the rightblk_en pin making this a rightmost pixel. With Block H abutted next to Block H, leftblk_en of the Right Block H is disabled and rightblk_en of the Left Block H is disabled, therefore those SRAM blocks are set to be the Middle Blocks.

The same operation can be carried out for blocks A, B and C at the top of the pixel.

In this way, the operation of the SRAM is configured depending on its location and what abuts next to each part. The blocks can be formed to be physically identical while still having different operations.

The above has described the operation and shows the operation of one set of pixels, however, different pixel arrangements can be used. For example, this can be used in a system where multiple different elements are arranged next to one another.

Also, while the above describes how this would be used to handle dark pixels, this configuration could also be used for other things. As one additional embodiment, in image sensors with color filters, color interpolation is needed which requires up to 9 surrounding pixels to do. In the embodiment of a stitched sensor, we want to do color interpolation from each readout port without having to combine the whole image together. This operation would need pixel values outside of the port. The same technique described above of the decoding scheme can be used to readout extra columns to the left and right of the readout port (330), giving the port extra columns to the left and right and allowing color processing the be done per port.

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, other kinds of circuits can be controlled in this way. Any kinds of photo receptors can be used with this system, for example, including a visible photoreceptor or an infrared photoreceptor.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments.

The various illustrative logical blocks, modules, and circuits described in connection with the embodiments disclosed herein, may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. The processor can be part of a computer system that also has a user interface port that communicates with a user interface, and which receives commands entered by a user, has at least one memory (e.g., hard drive or other comparable storage, and random access memory) that stores electronic information including a program that operates under control of the processor and with communication via the user interface port, and a video output that produces its output via any kind of video output format, e.g., VGA, DVI, HDMI, displayport, or any other form. This may include laptop or desktop computers, and may also include portable computers, including cell phones, tablets such as the IPAD™, and all other kinds of computers and computing platforms.

A processor may can be used to control the operation, or alternatively the operation can be controlled by a controller. The processor may be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor, using cloud computing, or in combinations. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of tangible storage medium that stores tangible, non transitory computer based instructions. An exemplary storage medium is coupled to the processor such that the processor can read information from, and write information to, the storage medium. In the alternative, the storage medium may be integral to the processor. The processor and the storage medium may reside in reconfigurable logic of any type.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer.

The memory storage can also be rotating magnetic hard disk drives, optical disk drives, or flash memory based storage drives or other such solid state, magnetic, or optical storage devices. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. The computer readable media can be an article comprising a machine-readable non-transitory tangible medium embodying information indicative of instructions that when performed by one or more machines result in computer implemented operations comprising the actions described throughout this specification.

Operations as described herein can be carried out on or over a website. The website can be operated on a server computer, or operated locally, e.g., by being downloaded to the client computer, or operated via a server farm. The website can be accessed over a mobile phone or a PDA, or on any other client. The website can use HTML code in any form, e.g., MHTML, or XML, and via any form such as cascading style sheets ("CSS") or other.

Also, the inventor(s) intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A stitched image sensor array, comprising:
   a semiconductor substrate;
   a first block, fabricated on the substrate, said first block having a first configuration that operates as part of an image sensor assembly;
   a second block, also fabricated on the substrate, the second block having the same first configuration as the first block, and being identical to the first block;
   wherein said first configuration includes enable inputs on both said first and second blocks,
   a first of said enable inputs being on a left side of the first block, and a connection of said first enable input detecting whether there is a neighboring block on the left side of the first block, and a second of said enable inputs being on a right side of the first block, and a connection of said second enable input detecting whether there is a neighboring block on the right side of the first block,
   the connection of said first and second enable inputs configuring said first block to function between being a left side block, a middle block, and a right side block, and each of the left side block, middle block, and right side block operate differently.

2. The array as in claim 1, wherein said enable inputs set a number of items that the first configuration is configured to process between a first nonzero number of items being processed and a second nonzero number of items being processed.

3. The array as in claim 1, wherein the first and second blocks are SRAMs, and the enable inputs set a number of items that the SRAM will pass through.

4. The array as in claim 1, wherein the first and second blocks are next to each other on the substrate, and the first enable input to the first block is set by connection to the second block as said neighboring block.

5. The array as in claim 4, further comprising a third-block, also fabricated on the substrate, the third block having the same first configuration as the first block, and being identical to the first block, and the third block being next to the second block on an opposite side from said first block;
   And wherein another enable input on the second block is connected to said third block,
   And where connection of said enable inputs to both of said first block and third block set a configuration of the second block to a configuration indicating a middle configuration.

6. The array as in claim 1, further comprising plural different image sensor blocks fabricated on the substrate, each of said image sensor blocks having an identical configuration, a first image sensor block connected to said first block, and a second image sensor block connected to said second block.

7. The array as in claim 1, further comprising an n bit decoder, receiving information from said enable inputs, and setting a configuration of the array based on levels of the enable inputs.

8. The array as in claim 7, wherein said n bit decoder is a 2 bit decoder, that sets the configuration to be one of a left configuration, right configuration or a middle configuration.

9. The array as in claim 1, wherein the enable inputs are set by connections to neighboring blocks, where the first block on a first side of the second block sets the block configuration of the second block to have extra processed values.

10. The array as in claim 9, wherein the extra processed values are values of dark pixels outside a viewable area of the image sensor array.

11. The array as in claim 9, wherein the extra processed values are values used for color interpolation within the image sensor array.

12. The array as in claim 1, further comprising connections on the first and second blocks that are grounded, a first block connection connected to an enable input of the second block, and a second block connection connected to an enable input of the first block.

13. The array as in claim 8, wherein the 2 bit decoder senses a connection of left and/or right neighboring blocks and sets the configuration to be one of the left configuration, right configuration or a middle configuration depending on the connection.

* * * * *